United States Patent
You et al.

(10) Patent No.: US 10,608,537 B2
(45) Date of Patent: Mar. 31, 2020

(54) INPUT CALIBRATION FOR SWITCHING VOLTAGE REGULATORS

(71) Applicant: Infineon Technologies Austria AG, Villach (AT)

(72) Inventors: Zhiqing You, Torrance, CA (US); Tim Ng, Monterey Park, CA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/504,045

(22) Filed: Jul. 5, 2019

(65) Prior Publication Data

US 2019/0334438 A1    Oct. 31, 2019

Related U.S. Application Data

(63) Continuation of application No. 15/421,460, filed on Feb. 1, 2017, now Pat. No. 10,389,242.

(51) Int. Cl.
*H02M 3/158* (2006.01)
*G01R 31/40* (2020.01)
*G01R 35/00* (2006.01)
*H02M 1/00* (2006.01)

(52) U.S. Cl.
CPC ............ *H02M 3/158* (2013.01); *G01R 31/40* (2013.01); *G01R 35/005* (2013.01); *H02M 2001/0009* (2013.01); *H02M 2001/0022* (2013.01)

(58) Field of Classification Search
CPC .............................................. H02M 2001/0009
See application file for complete search history.

(56) References Cited

U.S. PATENT DOCUMENTS

| | | |
|---|---|---|
| 4,027,227 A | 5/1977 | Engel |
| 4,278,930 A | 7/1981 | Rogers |
| 4,309,650 A | 1/1982 | Boros et al. |

(Continued)

FOREIGN PATENT DOCUMENTS

| | | |
|---|---|---|
| CN | 101988943 A | 3/2011 |
| CN | 102263505 A | 11/2011 |

(Continued)

OTHER PUBLICATIONS

Pyakuryal, Sudeep, et al., "Filter Design for AC to DC Converter", International Refereed Journal of Engineering and Science (IRJES), vol. 2, Issue 6, Jun. 2013, pp. 42-49.

*Primary Examiner* — Fred E Finch, III
*Assistant Examiner* — Rafael O. De León Domenech
(74) *Attorney, Agent, or Firm* — Murphy, Bilak & Homiller, PLLC

(57) ABSTRACT

A voltage regulator includes a power stage electrically coupled to an input voltage terminal, a controller for controlling the power stage and a shunt resistor of a sense network connected in series between the input voltage terminal and the power stage. In a non-calibration mode, a first level shifting resistor of the sense network is electrically connected in series between a first terminal of the shunt resistor and a first sense pin of the controller and a second level shifting resistor of the sense network is electrically connected in series between a second terminal of the shunt resistor and a second sense pin of the controller. In a calibration mode, the first sense pin and the second sense pin of the controller are electrically connected to the same terminal of the shunt resistor via the first level shifting resistor and the second level shifting resistor of the sense network.

20 Claims, 4 Drawing Sheets

(56) References Cited

U.S. PATENT DOCUMENTS

| | | |
|---|---|---|
| 4,811,184 A | 3/1989 | Koninsky et al. |
| 5,889,387 A | 3/1999 | Massie |
| 5,900,714 A | 5/1999 | Dubhashi et al. |
| 6,184,660 B1 | 2/2001 | Hatular |
| 6,294,904 B1 | 9/2001 | Hirst |
| 6,424,129 B1 | 7/2002 | Lethellier |
| 7,629,787 B2 | 12/2009 | Lu |
| 7,695,189 B2 | 4/2010 | Lim et al. |
| 8,120,336 B2 | 2/2012 | Mehas et al. |
| 8,125,188 B2 | 2/2012 | Doell et al. |
| 8,710,810 B1 | 4/2014 | McJimsey et al. |
| 9,780,763 B1 | 10/2017 | Lu et al. |
| 9,941,894 B1 | 4/2018 | Gu et al. |
| 2005/0071116 A1 | 3/2005 | Kim |
| 2005/0168198 A1 | 8/2005 | Maksimovic et al. |
| 2005/0219872 A1 | 10/2005 | Lys |
| 2005/0248477 A1 | 11/2005 | Jongsma et al. |
| 2006/0001408 A1 | 1/2006 | Southwell et al. |
| 2006/0267687 A1 | 11/2006 | Gammie et al. |
| 2007/0013350 A1 | 1/2007 | Tang et al. |
| 2007/0046281 A1 | 3/2007 | Domingo et al. |
| 2007/0241763 A1 | 10/2007 | Panhofer |
| 2009/0201086 A1 | 8/2009 | Kindt et al. |
| 2009/0261795 A1 | 10/2009 | Tang et al. |
| 2009/0306914 A1 | 12/2009 | Cohen |
| 2010/0007217 A1 | 1/2010 | Steele et al. |
| 2010/0052611 A1 | 3/2010 | Lyle, Jr. |
| 2010/0231187 A1 | 9/2010 | Wicht et al. |
| 2010/0277142 A1 | 11/2010 | Tan et al. |
| 2011/0114842 A1 | 5/2011 | Ji et al. |
| 2012/0062240 A1 | 3/2012 | Nishijima |
| 2012/0101750 A1 | 4/2012 | Chen et al. |
| 2012/0194258 A1 | 8/2012 | Nien et al. |
| 2012/0281433 A1 | 11/2012 | Yamanaka |
| 2013/0135047 A1 | 5/2013 | Danioni |
| 2013/0193879 A1 | 8/2013 | Sadwick et al. |
| 2013/0194839 A1 | 8/2013 | Barbati et al. |
| 2013/0342273 A1 | 12/2013 | Petrie |
| 2014/0052394 A1 | 2/2014 | Sun |
| 2014/0077741 A1 | 3/2014 | Kumagai et al. |
| 2014/0159734 A1 | 6/2014 | Knill |
| 2014/0312818 A1 | 10/2014 | Furuchi |
| 2014/0354303 A1 | 12/2014 | Harrison |
| 2014/0376279 A1 | 12/2014 | Park |
| 2015/0015160 A1 | 1/2015 | Angelin et al. |
| 2015/0061407 A1 | 3/2015 | Sen et al. |
| 2015/0089253 A1 | 3/2015 | Doering et al. |
| 2015/0146328 A1 | 5/2015 | Mikami et al. |
| 2015/0346758 A1 | 12/2015 | Sakakibara |
| 2016/0149489 A1 | 5/2016 | Tang et al. |
| 2016/0268899 A1 | 9/2016 | Rader et al. |
| 2016/0291631 A1 | 10/2016 | Sen et al. |
| 2018/0219482 A1 | 8/2018 | You et al. |

FOREIGN PATENT DOCUMENTS

| | | |
|---|---|---|
| CN | 102692541 A | 9/2012 |
| CN | 102782512 A | 11/2012 |
| CN | 103176495 A | 6/2013 |
| CN | 203445784 U | 2/2014 |
| CN | 104391534 A | 3/2015 |
| CN | 106059291 A | 10/2016 |
| GB | 2470214 | 11/2010 |
| JP | 2002051540 A | 2/2002 |
| JP | 2013038251 A | 2/2013 |
| TW | 200909822 A | 3/2009 |

INPUT CALIBRATION FOR SWITCHING VOLTAGE REGULATORS

TECHNICAL FIELD

The present application relates to switching voltage regulators, in particular voltage and current sensing calibration for switching voltage regulators.

BACKGROUND

Switching voltage regulators generate an output voltage from an input voltage and are implemented with active components such as a pulse width modulation controller (PWM), driver, power MOSFETs, and passive components such as inductors, transformers or coupled inductors, capacitors, and resistors. Controllers typically measure the output current and output voltage in order to regulate and monitor the output voltage. Measuring the input current and input voltage allow the controller to improve regulation and monitoring, as well as monitoring input power for voltage, current, and power constraints.

Knowledge of the regulator input current and voltage is required in some controllers for improved regulation algorithms and monitoring input power for voltage, current, and power constraints. Measuring the input current and voltage requires external and internal sense circuitry in the controller. However, components in the sensing network may drift over time which introduces offset errors. The input voltage and operating temperature can also change, introducing further offset errors. Additional offset error can be introduced when the load is applied (active).

Calibration can be used to account for offset errors. However, offset calibration requires the sensed input signal to be zero which may not be guaranteed during system run time i.e. when the load is applied (active). Accordingly, components with very high precision and accuracy with the lowest temperature drift are conventionally in place of performing offset calibration. These kind of components are not standard and therefore increase overall cost. Another conventional approach involves performing offset calibration only when the regulator system is off. However, some regulator systems never turn off meaning that the error introduced by component drift during run time is never addressed. Also, some regulator systems recycle power infrequently and the sense circuit component values may have drifted before the next power cycle. A cost-effective calibration technique and circuit which can be used during voltage regulator run time is therefore desirable.

SUMMARY

According to an embodiment of a voltage regulator, the voltage regulator comprises an input voltage terminal, a power stage electrically coupled to the input voltage terminal, a controller configured to control switching of the power stage, a sense network and a calibration circuit. The sense network comprises a shunt resistor connected in series between the input voltage terminal and the power stage, a first level shifting resistor connected in series between a first terminal of the shunt resistor and a first sense pin of the controller, and a second level shifting resistor connected in series between a second terminal of the shunt resistor and a second sense pin of the controller. The calibration circuit is configured to electrically connect the first sense pin and the second sense pin of the controller to the same terminal of the shunt resistor via the first level shifting resistor and the second level shifting resistor of the sense network, responsive to the controller entering a calibration mode.

According to an embodiment of a method of operating a voltage regulator having a power stage electrically coupled to an input voltage terminal, a controller for controlling the power stage and a shunt resistor of a sense network connected in series between the input voltage terminal and the power stage, the method comprises: in a non-calibration mode, electrically connecting a first level shifting resistor of the sense network in series between a first terminal of the shunt resistor and a first sense pin of the controller and electrically connecting a second level shifting resistor of the sense network in series between a second terminal of the shunt resistor and a second sense pin of the controller; and in a calibration mode, electrically connecting the first sense pin and the second sense pin of the controller to the same terminal of the shunt resistor via the first level shifting resistor and the second level shifting resistor of the sense network.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide voltage and current sensing calibration for switching voltage regulators. A sense network external to the switching voltage regulator controller includes a low ohmic shunt resistor connected to the input power rail of the regulator, so that the voltage across the shunt resistor is proportional to the input current. The sense network also includes high ohmic series resistors connecting the terminals of the shunt resistor to respective sense (input) pins on the regulator controller. A calibration circuit also external to the controller enables the controller to measure the offset during calibration periods. Offset calibration can be activated not only when the regulator system is off, but also during run time when the load connected to the regulator is active. The offset calibration can be triggered based on lapsed time, temperature, input voltage, bus command or change in load condition. The regulator controller activates the external calibration circuit via an output pin, to implement the calibration process. During calibration, the regulator does not need to cease operation.

Figure 1:
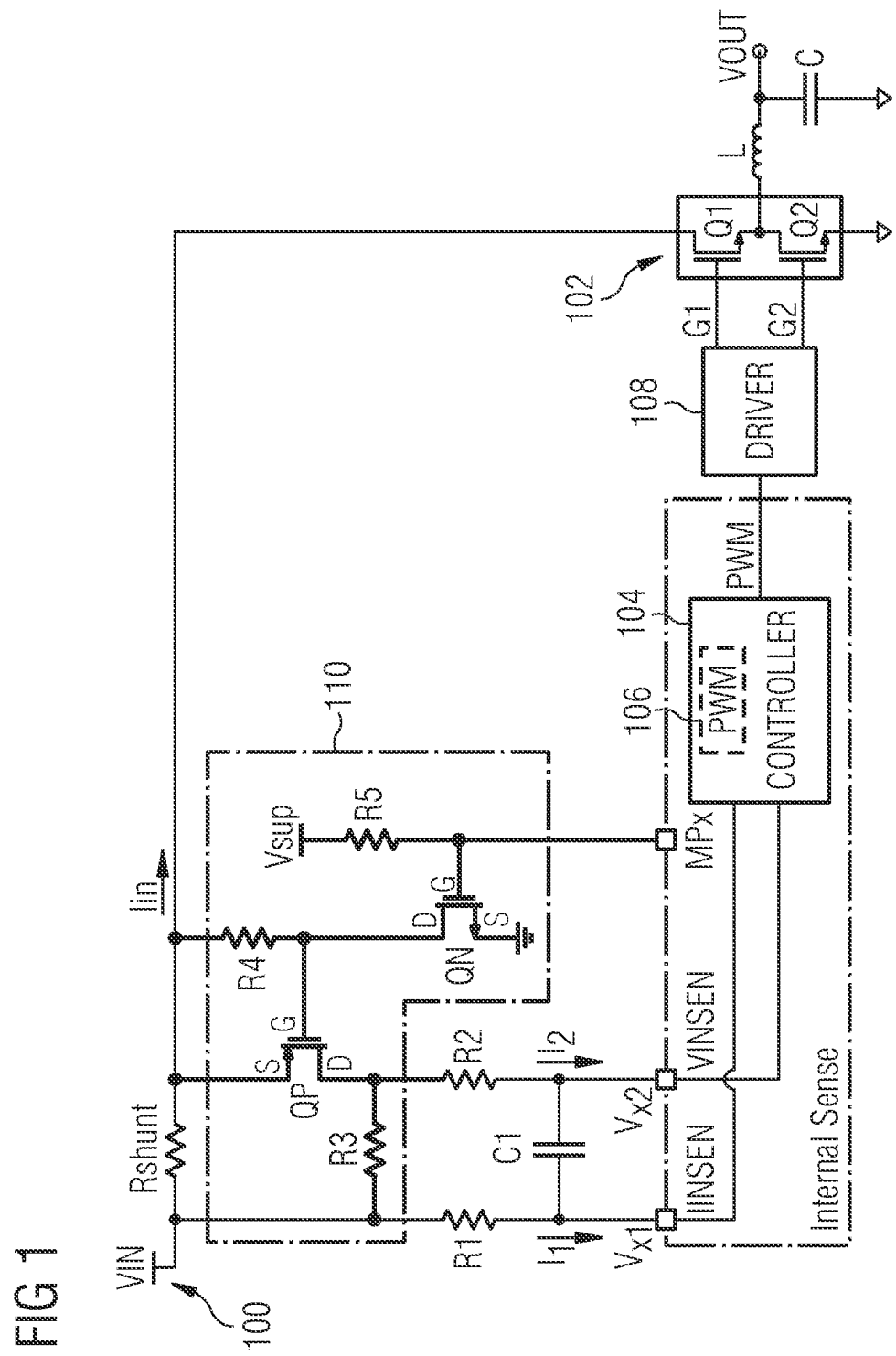
FIG. 1 illustrates a block diagram of an embodiment of a voltage regulator having a calibration circuit.

FIG. 1 illustrates an embodiment of a switching voltage regulator. The voltage regulator comprises an input voltage terminal 100, a power stage 102 configured to produce an output voltage (Vout) from an input voltage (Vin) at the input voltage terminal 100, and a controller 104 such as a microcontroller, microprocessor, ASIC (application-specific integrated-circuit), etc. configured to control switching of the power stage 102. The power stage 102 is electrically coupled to the input voltage terminal 100, and electrically coupled to an external load (not shown) through an output inductor (L) and capacitor (C) in FIG. 1. Alternatively, the power stage 102 can be coupled to the load through a transformer or coupled inductors e.g. in a flyback configuration.

The voltage and current sensing calibration techniques described herein are not limited to just buck and flyback converters/regulators. The voltage and current sensing calibration techniques described herein can be applied to any converter/regulator application that requires current sense calibration at a high voltage level. The voltage and current sensing calibration techniques are described next in the context of the buck converter shown in FIG. 1 for ease of explanation only. These techniques can be readily extended to other types of isolated or non-isolated voltage regulators/converters that require current sense calibration at a high voltage level.

Returning to the exemplary buck converter system shown in FIG. 1, the power stage 102 has one or more phases coupled to the load. In the embodiment of FIG. 1, each phase includes a high-side transistor (Q1) and a low-side transistor (Q2) for coupling the power stage 102 to the load. The high-side transistor Q1 switchably connects the load to the input voltage rail (Vin) of the voltage regulator, and the corresponding low-side transistor Q2 switchably connects the load to ground at different periods. The power stage 102 is shown with one phase in FIG. 1 for ease of illustration. In general, the power stage 102 can include any desired number of phases including one phase (single-phase implementation) or more than one phase (multi-phase implementation). The load powered by the voltage regulator can be a high-performance integrated circuit such as a microprocessor, graphics processor, network processor, etc. or other type of integrated circuit requiring voltage regulation such as a POL (point-of-load).

The controller 104 regulates the voltage (Vout) delivered to the load by the power stage 102, by adjusting the current delivered to the load. The controller 104 can include a pulse width modulator (PWM) unit 106 for switching the transistors Q1, Q2 of the power stage 102 via a corresponding PWM control signal (PWM) so that the power stage 102 sources or sinks current to the load. When the PWM control signal is at a logic level high, the high-side transistor Q1 is placed in a conductive state, the inductor current is sourced or sunk through the high-side transistor Q1, and the current through the inductor increases for the duration. This is generally referred to as the 'on-time' and the power stage 102 is considered to be 'turned on'. When the PWM control signal is at a logic level low, the corresponding low-side transistor Q2 is placed in a conductive state, current is sourced or sunk from the low-side transistor Q2, and the current through the inductor decreases for the duration. This is generally referred to as the 'off-time' and the power stage 102 is considered to be 'turned off'. When the PWM control signal is at a trivalent or high impedance logic level (the PWM control signal is neither high nor low, both the high-side and the low-side transistors Q1, Q2 are placed in a non-conductive state, current is sourced or sunk through either the low-side or high-side transistor body diodes, and the magnitude of the current through the inductor decreases towards zero. This is generally referred to as the 'HiZ-time' or 'inactive time' and the power stage 102 is considered to be in 'High Z' or inactive.

In DCM (discontinuous conduction mode), the low-side transistor Q2 is not allowed to be conductive when the inductor current reaches zero. The cycle then consists of an on-time, followed by an off-time, followed by a HiZ time. During the HiZ time, the inductor current approaches zero and does not change for the duration of the cycle once it is zero. As a result, the inductor current does reach zero during part of the switching cycle in DCM. In CCM (continuous conduction mode), the inductor current does not stop at zero between switching cycles. That is in DCM, the inductor current is always positive or zero and in CCM the inductor current can be positive or negative but does not stay at zero. The inductor current can cross zero and go negative e.g. at no-load, and the voltage regulator can operate in CCM where the triangular inductor current is centered at zero.

In either CCM or DCM, driver circuitry 108 provides respective gate drive signals G1, G2 to the gates of the high-side and low-side transistors Q1, Q2 of the power stage 102 in response to the PWM control signals provided by the controller 104. The activation state of each power stage phase and the duty cycle of the corresponding high-side and low-side transistors Q1, Q2 are determined at least in part based on the output voltage (Vout) applied to the load so that the voltage regulator can react as quickly and reliably as possible to changing load conditions.

The controller 104 can manage changes from one reference voltage to another. The controller 104 can also determine errors between the output voltage (Vout) and a reference voltage, and convert the error voltage into a digital representation provided to the PWM unit 106 of the controller 104 for modifying the switching cycle of power stage transistors Q1, Q2 e.g. by adjusting the duty cycle. Such voltage regulation functions are standard in typical digitally-controlled switching voltage regulators, and therefore no further explanation is given in this regard.

In addition to regulating the voltage delivered to the load, the controller 104 also senses the input voltage and/or input current internally without the use of external amplifiers and without the controller 104 having to connect to voltages exceeding its maximum voltage rating, even though the regulator input voltage rail Vin (e.g. 12V) may be significantly higher than the internal supply rail (e.g. 3.3 V) of the controller 104. To this end, the controller 104 measures the input voltage and/or input current using a resistive sense network.

The resistive sense network includes a low ohmic shunt resistor Rshunt and a pair of high ohmic level shifting series resistors R1, R2. The shunt resistor Rshunt is connected in series between the input voltage terminal 100 and the power stage 102. The voltage ($V_{Rshunt}$) across the shunt resistor Rshunt is a function or representation of the input current (Iin). Each level shifting resistor R1, R2 connects one terminal of the shunt resistor Rshunt to a sense (input) pin IINSEN, VINSEN of the controller 104, to allow the controller 104 to measure the input voltage and/or input current. In one embodiment, the controller 104 measures the input voltage and/or input current by providing a bias current to the sense pins IINSEN, VINSEN. The level shifting resistors R1, R2 allow the high voltage input current to be level shifted to an appropriate input voltage to the controller 104. This way, the maximum voltage permitted at the sense pins IINSEN, VINSEN is not exceeded even though the regulator input voltage rail is higher than the maximum voltage of the sense pins. For example, the input voltage may be 12V and the maximum voltage permitted at the sense pins IINSEN, VINSEN may be 1.5V to 2V. The level shifting resistors R1, R2 draw a current to drop the input voltage Vin to a voltage level no greater than 1.5V to 2V, but still provide the voltage $V_{Rshunt}$ across the shunt resistor Rshunt at the sense pins IINSEN, VINSEN of the controller 104 in the non-calibration mode if the level shifting resistors Rx1, Rx2 are well matched.

The shunt resistor Rshunt included in the sense network preferably has a resistance in the milli to micro Ohm range. The shunt resistor Rshunt is lossy in that it lowers system efficiency by slightly reducing the input voltage rail for the power stage 102 as given by $Power_{loss}=Iin^2*R_{sh}$. However, by using a shunt resistor Rshunt having a resistance in the milli to micro Ohm range, the voltage drop ($V_{Rshunt}$) across the input voltage rail Vin of the regulator is minimized and therefore the power loss ($Power_{loss}$) also is minimized in the non-calibration mode. For example, the voltage drop $V_{Rshunt}$ across the shunt resistor Rshunt is about 5 mV for a shunt resistance in the micro Ohm range.

In contrast to the shunt resistor Rshunt, the level shifting resistors R1, R2 are high ohmic to minimize power loss from the input voltage rail Vin as given by $Power_{loss}=(Vin-Vsense)^2/R_x$ where Vsense is the voltage (Vx1 or Vx2) measured at one of the controller sense pins IINSEN, VINSEN and Rx is the level shifting resistor that connects that sense pin to a terminal of the shunt resistor Rshunt. Vsense can be measured via either level shifting resistor R1, R2. The level shifting resistors R1, R2 are well matched to each other (i.e. highly precise) and have a resistance which is orders of magnitude higher than that of the shunt resistor Rshunt e.g. preferably in the mega Ohm range. Each of the resistors Rshunt, R1, R2 included in the sense network can comprise one or more individual resistors.

For example, the shunt resistor Rshunt can be physically implemented as a single low ohmic discrete resistor or a plurality of low ohmic discrete resistors connected in parallel. The first level shifting resistor R1 can be physically implemented as a single high ohmic discrete resistor or a plurality of high ohmic discrete resistors R1A, R1B, . . . , R1X connected in series between the shunt resistor terminal connected to the input voltage terminal 100 of the regulator and the IINSEN sense pin of the controller 104. In a similar way, the second level shifting resistor R2 can be physically implemented as a single high ohmic discrete resistor or a plurality of high ohmic discrete resistors R2A, R2B, R2X connected in series between the shunt resistor terminal connected to the power stage 102 and the VINSEN sense pin of the controller 104.

With the external resistive sense network described above, the controller 104 can sense the input current (Iin) of the regulator as a function of the voltage $V_{Rshunt}$ across the shunt resistor as given by $Iin=f(V_{Rshunt})$, as shifted down by the level shifting resistors R1, R2 and measured across the sense pins IINSEN, VINSEN as a function of Vsense=Vx1–Vx2 in the non-calibration mode. The controller 104 also can sense the input voltage Vin of the regulator as a function of the current ($I_1$, $I_2$) flowing through either one of the level shifting resistors R1, R2 as given by $Vin=f(I_N)$, as measured at the corresponding sense pin IINSEN, VINSEN in the non-calibration mode.

One or more components included in the resistive sense network may drift over time and/or temperature, introducing offset errors in the telemetry data measured and used by the regulator controller. The input voltage can also change, introducing further offset error. Other offset error can be introduced when the load is applied (active). The switching voltage regulator includes a calibration circuit 110 for mitigating such offset errors.

The calibration circuit 110 is external to the regulator controller 104 and is configured to electrically connect the first sense pin IINSEN and the second sense pin VINSEN of the controller 104 to the same terminal of the shunt resistor Rshunt via the first level shifting resistor R1 and the second level shifting resistor R2 of the sense network, responsive to the controller 104 entering a calibration mode. This way, in the calibration mode, the calibration circuit 110 bypasses the shunt resistor Rshunt of the sense network and the sense pins IINSEN, VINSEN of the controller 104 are tied to same node potential (Vin in FIG. 1). If no current flows through the shunt resistor Rshunt, the sense network output should be zero. If the output as measured by the controller 104 is nonzero in the calibration mode, then the nonzero value represents the offset. The controller 104 can execute the calibration mode even under load conditions. That is, the controller 104 can switch the power stage 102 to regulate a load coupled to the power stage 102 when the controller 104 is in the calibration mode.

In the non-calibration mode, the first level shifting resistor R1 of the sense network is electrically connected in series between the first terminal of the shunt resistor Rshunt and the first sense pin IINSEN of the controller 104 and the second level shifting resistor R2 of the sense network is electrically connected in series between the second terminal of the shunt resistor Rshunt and the second sense pin VINSEN of the controller 104. In the non-calibration mode, the controller 104 measures input voltage and/or current as a function of the voltage $V_{Rshunt}$ across the shunt resistor Rshunt as explained above. The controller 104 can use the current and/or voltage measured in the calibration mode as an offset for adjusting corresponding measurements taken by the controller 104 at the first and the second sense pins IINSEN, VINSEN in the non-calibration mode, when the first level shifting resistor R1 is connected to the first terminal of the shunt resistor Rshunt and the second level shifting resistor R2 is connected to the second terminal of the shunt resistor Rshunt.

Figure 2:
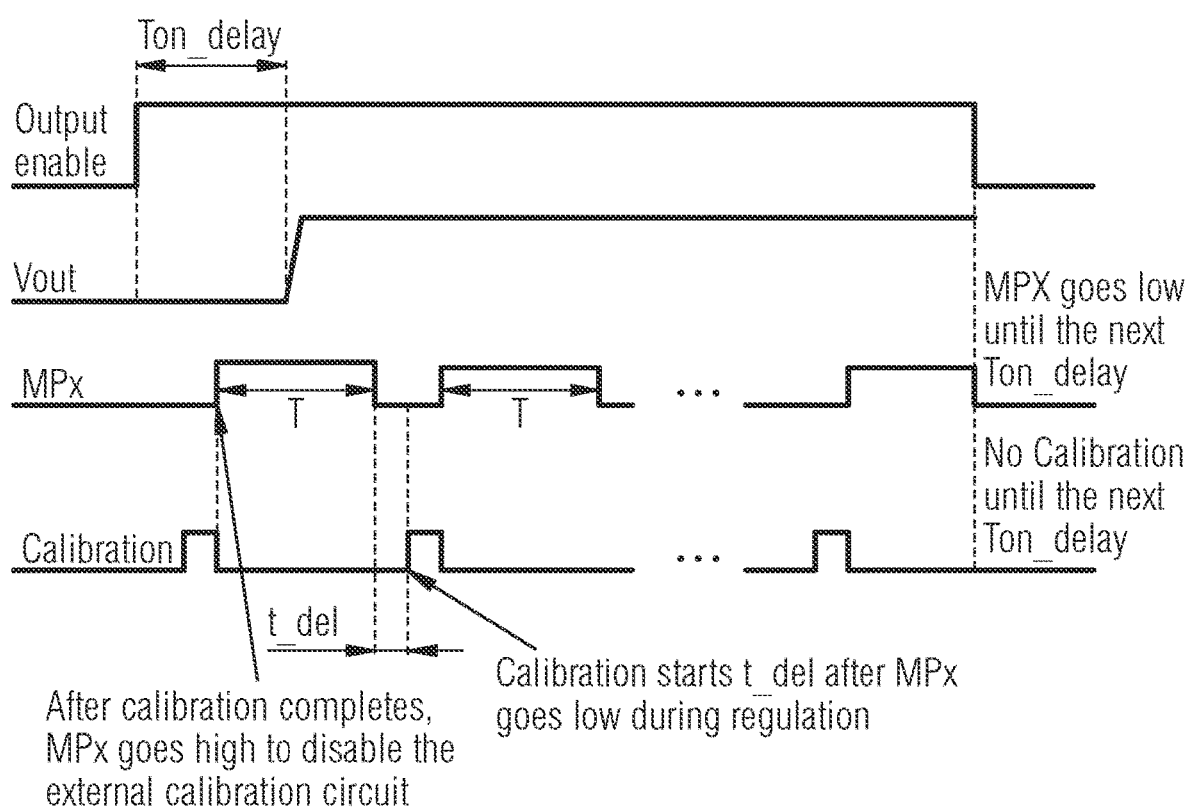
FIG. 2 illustrates various waveforms associated with the operation of the voltage regulator shown in FIG. 1.

FIG. 2 illustrates various waveforms associated with the operation of the controller 104 and calibration circuit 110 in both the calibration and non-calibration modes, while the switching voltage regulator is active (actively regulating a load). Some time period (Ton_delay) after the output of the switching voltage regulator is enabled, the output voltage Vout of the regulator begins to rise to its regulated value. The waveform labeled "Calibration" in FIG. 2 indicates when the controller 104 is in the calibration mode. The controller 104 outputs a signal at pin MPx for indicating to the calibration circuit 110 when the controller 104 is entering the calibration mode. The controller 104 remains in the non-calibration mode for a period of time T during which the external calibration circuit 110 is disabled. In the non-calibration mode, the first level shifting resistor R1 of the sense network is connected to the first terminal of the shunt resistor Rshunt, the second level shifting resistor R2 is connected to the second terminal of the shunt resistor Rshunt and the controller 104 measures input voltage and/or current as a function of the voltage $V_{Rshunt}$ across the shunt resistor Rshunt as previously explained herein.

After the controller pin MPx goes low for some time t_del (e.g. settling time), the calibration circuit 110 connects the sense pins IINSEN, VINSEN of the controller 104 to same terminal of the shunt resistor Rshunt e.g. the terminal of Rshunt connected to the input voltage terminal 100 of the regulator as shown in FIG. 2. In the calibration mode, the output of the sense network should be zero if no offset is present. If offset is present in the calibration mode, the controller compensates for the offset in the subsequent non-calibration period based upon the value sensed at pins IINSEN, VINSEN in the present calibration period. For example, in the case of a linear offset, the controller 104 can subtract the offset measured in the most recent calibration period from voltage and/or current measurements taken in the subsequent non-calibration period.

According to an embodiment, the calibration circuit 110 includes a first transistor QP connected in series between the second terminal of the shunt resistor Rshunt and the second level shifting resistor R2 of the sense network, a second transistor QN connected to the gate of the first transistor QP and a resistor R3 having a first terminal connected to the first terminal of the shunt resistor Rshunt and a second terminal connected between the first transistor QP and the second level shifting resistor R2. The second transistor QN is configured to switch off the first transistor QP responsive to a calibration mode signal output at pin MPx of the controller 104 and applied to the gate of the second transistor QN. The calibration mode signal indicates the controller 104 is entering the calibration mode, as explained above in connection with FIG. 2. The first transistor QP of the calibration circuit 110 is configured to disconnect the second terminal of the shunt resistor Rshunt from the second level shifting resistor R2 of the sense network when QP is switched off (i.e. not conducting).

For example, the first transistor QP can be a p-channel transistor and the second transistor QN can be an n-channel transistor. The calibration circuit 110 can include a first pull-up resistor R4 connecting the gate of the p-channel transistor QP to the second terminal of the shunt resistor Rshunt, and a second pull-up resistor R5 connecting the gate of the n-channel transistor QN to a voltage supply (Vsup). When pin MPx of the controller 104 goes high during a new non-calibration period, n-channel transistor QN of the calibration circuit 110 turns on which in turns pulls the gate of p-channel transistor QP to ground, turning on QP. With p-channel transistor QP on, the second terminal of the shunt resistor Rshunt is electrically connected to the second sense pin VINSEN of the controller 104 via the second level shifting resistor R2 of the sense network. Also, resistor R3 of the calibration circuit 110 is in parallel with the shunt resistor Rshunt of the sense network.

When pin MPx of the controller 104 goes low during a new calibration period, the gate of n-channel transistor QN is pulled down to ground which eventually turns off QN. With n-channel transistor QN off, the gate of p-channel transistor QP is pulled up to Vin–$V_{Rshunt}$ which eventually turns off QP. With p-channel transistor QP off, the second terminal of the shunt resistor Rshunt is electrically disconnected from the second level shifting resistor R2 of the sense network. Instead, the second level shifting resistor R2 is electrically connected to the same terminal of the shunt resistor Rshunt as the first level shifting resistor R1 via resistor R3 of the calibration circuit 110. This way, both sense pins IINSEN and VINSEN of the controller 104 are electrically connected to the same node potential e.g. Vin in FIG. 1. Any offset present in the calibration mode is measured by the controller 104 in this configuration as explained previously herein.

Resistor R3 of the calibration circuit 110 is one or a few orders of magnitude larger than the shunt resistor Rshunt of the sense network, and several orders of magnitude smaller than the level shifting resistors R1, R2 of the sense network. For example, resistor R3 can be in a range between 1 Ohm and 10 Ohms. However, current going through resistor R3 introduces a small offset. Moreover, since resistor R3 is in parallel with the shunt Rshunt of the sense network, a small amount of gain error is introduced because the effective Rshunt value seen by the controller 104 changes slightly. This in turn introduces a small offset during the calibration process i.e. controller pin IINSEN sees resistance R1 and controller pin VINSEN sees resistance R2+R3.

Figure 3:
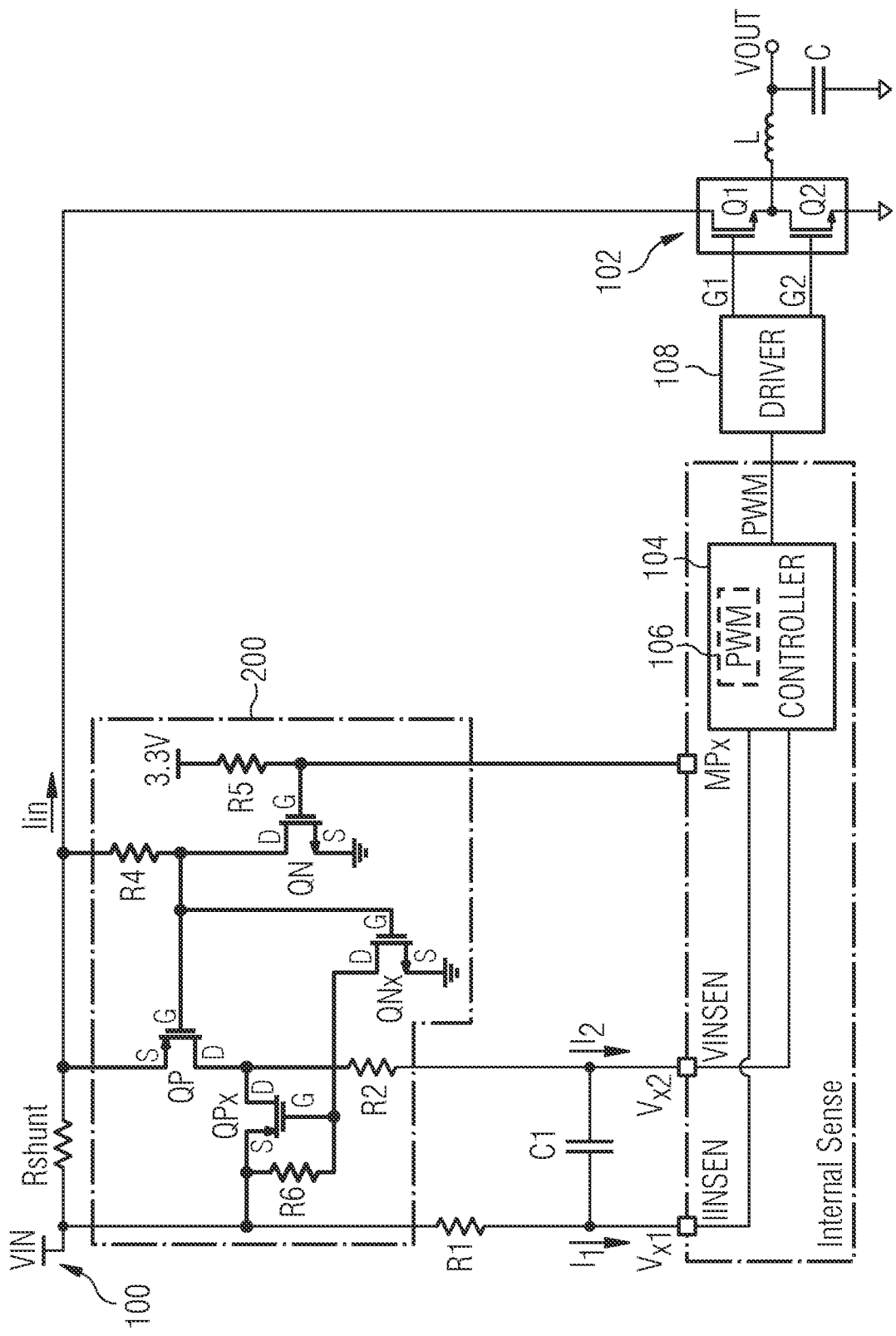
FIG. 3 illustrates a block diagram of another embodiment of a voltage regulator having a calibration circuit.

FIG. 3 illustrates another embodiment of a switching voltage regulator having a sense calibration circuit 200. The embodiment shown in FIG. 3 is similar to the embodiment shown in FIG. 2. Different, however, resistor R3 of the calibration circuit 110 in FIG. 1 is replaced by transistors QPx and QNx in FIG. 3. By replacing resistor R3 with transistors QPx and QNx, all current goes through the shunt resistor Rshunt of the sense network when transistors QPx and QNx are open (not conducting) in the non-calibration mode. In the calibration mode, the on resistance of transistors QPx and QNx are much smaller than resistor R3 so that any offset caused by the presence of resistors QPx and QNx in the calibration mode is negligible. However, the gates of transistors QPx and QNx must be controlled adequately to ensure proper operation in both the calibration and non-calibration modes.

To this end, transistor QPx connects the first terminal of the shunt resistor Rshunt between transistor QP of the calibration circuit 200 and the second level shifting resistor R2 of the sense network. Transistor QNx connects the gate of transistor QPx to ground. Transistors QP and QN of the calibration circuit 200 operate as described before in connection with FIGS. 1 and 2. That is, transistor QN is configured to switch off transistor QP responsive to a calibration mode signal present at pin MPx of the controller 104, the calibration mode signal indicating the controller 104 is entering the calibration mode. Transistor QP is configured to disconnect the second terminal of the shunt resistor Rshunt from the second level shifting resistor R2 of the sense network when QP is switched off. Transistor QPx is configured to disconnect the first terminal of the shunt resistor Rshunt from the second level shifting resistor R2 of the sense network if transistor QP is switched on. Transistor QNx is configured to switch on transistor QPx if transistor QP is switched off, to connect the first terminal of the shunt resistor Rshunt to the second level shifting resistor R2 of the sense network in the calibration mode.

In one embodiment, transistor QP of the calibration circuit 200 is a first p-channel transistor, transistor QN is a first n-channel transistor, transistor QPx is a second p-channel transistor and transistor QNx is a second n-channel transistor. The calibration circuit 200 also includes a first pull-up resistor R4 connecting the gate of first p-channel transistor QP to the second terminal of the shunt resistor Rshunt and a second pull-up resistor R5 connecting the gate of first n-channel transistor QN to voltage supply Vsup as previously described herein. In the embodiment illustrated in FIG. 3, the calibration circuit 200 further includes a third pull-up resistor R6 connecting the gate of second p-channel transistor QPx to the first terminal of the shunt resistor Rshunt. The pull-up transistors R4, R5, R6 ensure the gates of the respective transistors are properly biased as explained above. For example, the first pull-up resistor R4 ensures first p-channel transistor QP is off (i.e. not conducting) and second n-channel transistor QNx is on (i.e. conducting) in the calibration mode. The second pull-up resistor R5 ensures first n-channel transistor QN is on in the non-calibration mode. The third pull-up resistor R6 ensures second p-channel transistor QPx is off in the non-calibration mode.

The controller 104 can exit the non-calibration mode and enter the calibration mode responsive to a change in regulator temperature, a change in regulator input voltage, responsive to a command received by the controller, etc. The controller 104 can periodically enter the calibration mode at regularly occurring intervals, e.g. as illustrated in FIG. 2.

Figure 4:
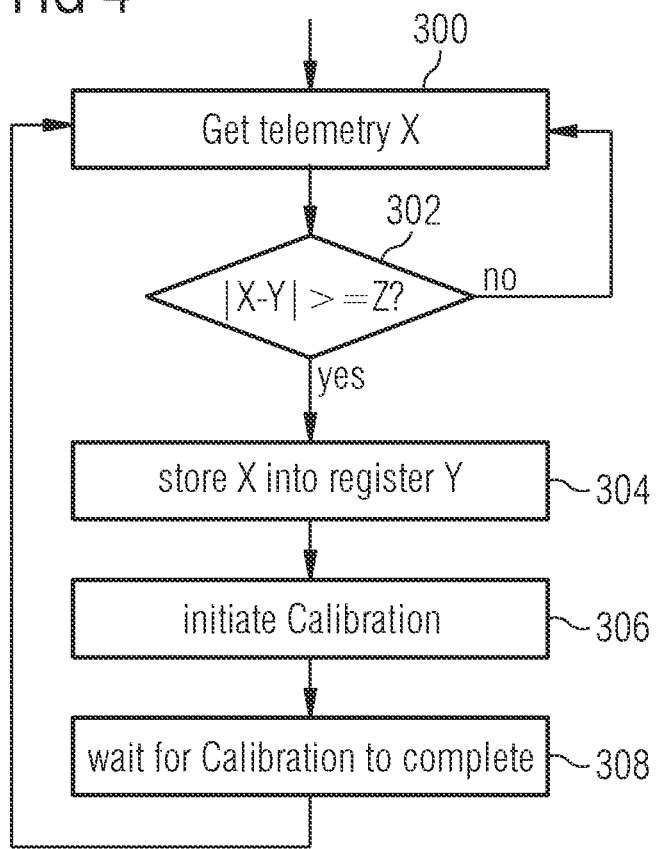
FIG. 4 illustrates a flow diagram of an embodiment of a calibration method for a voltage regulator.

FIG. 4 illustrates an embodiment of a method implemented by the controller 104 for entering the calibration mode responsive to a parameter such as regulator temperature, regulator input voltage, lapsed time, etc. changing by more than a predetermined amount compared to the same parameter from a prior calibration period. The controller 104 measures telemetry data such as time, temperature, input voltage, etc. in the non-calibration mode (Block 300). The controller 104 compares the telemetry data measured in the present non-calibration period to the telemetry data stored for the preceding calibration period (Block 302). If the telemetry data for the present non-calibration period (x) varies from the telemetry data stored for the preceding calibration period (y) by more than a predetermined amount (z), the prior stored telemetry data is replaced with the new telemetry data (Block 304) and the controller 104 enters the calibration mode (Block 306). For example, in the case of input voltage changing from X volts to Y volts and |X-Y| exceeding a limit of Z volts, 'X' replaces 'Y' in storage and the controller 104 enters the calibration mode. In the case of temperature changing from M degrees to N degrees and |M-N| exceeding a limit of Y degrees, 'M' replaces 'N' in storage and the controller 104 enters the calibration mode. In one embodiment, the parameter data (input voltage, temperature, etc.) is stored in a register included in the controller 104. Each parameter which can trigger the calibration process (e.g. time, voltage, temperature, etc.) is allocated a register for storing the corresponding data. The pertinent threshold value (labeled 'Z' in FIG. 4) can be programmable to provide additional flexibility. The controller 104 waits for the calibration process to complete before beginning the comparison process again (Block 308).

Figure 5:
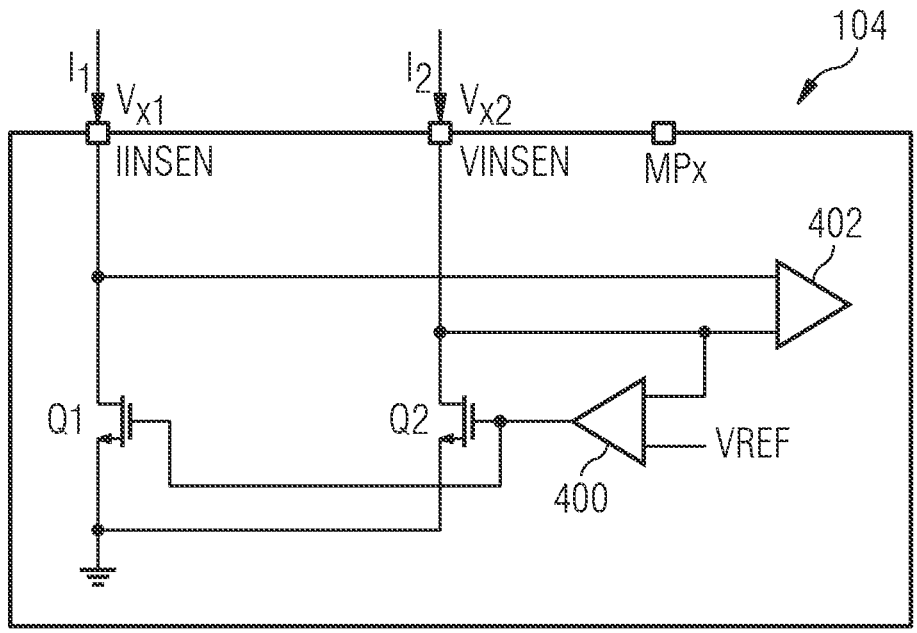
FIG. 5 illustrates an embodiment of input voltage and input current sense circuitry internal to the regulator controllers shown in FIGS. 1 and 3.

FIG. 5 illustrates an embodiment of the input voltage and input current sense circuitry internal to the regulator controller 104. According to this embodiment, the controller 104 comprises matched current mirrors Q1, Q2 each of which sinks current (I1, I2) through the corresponding level shifting resistor R1, R2 such that the voltage drop (Vx1, Vx2) across the level shifting resistors R1, R2 is substantially the same and the voltage across the sense pins (Vsense=Vx1−Vx2) substantially matches the voltage ($V_{Rshunt}$) across the shunt resistor Rshunt in the non-calibration mode. The controller 104 can sense the input current by using the matched current sources Q1, Q2 at both input pins IINSEN, VINSEN such that I1=I2. The voltage drop across both external level shifting resistors R1, R2 is the same such that the voltage across the controller sense pins IINSEN, VINSEN is equal to the voltage drop across the shunt resistor Rshunt as given by $V_{Rshunt}=V_{x1}-V_{x2}$ in the non-calibration mode.

The input voltage can be sensed as a function of the input current I1, I2 at one of the controller sense pins IINSEN, VINSEN. According to one embodiment, the controller 104 comprises a circuit 400 such as a feedback amplifier for regulating the voltage (Vx1, Vx2) at one of the sense pins IINSEN, VINSEN such that the voltage at this sense pin remains constant over a range of voltage levels at the input voltage terminal 100 and the current (I1, I2) through this sense pin is a function of the input voltage Vin. In more detail, the voltage (Vx1, Vx2) across the level shifting resistors R1, R2 should be matched in the non-calibration mode, and therefore well-matched current mirrors Q1, Q2 are used in this embodiment. Also, the input voltage Vin should be level shifted by the correct amount so that the maximum voltage of the controller sense pins IINSEN, VINSEN is not exceeded. As such, the feedback amplifier 400 forces the current (I1, I2) through one of the level shifting resistors R1, R2 such that the voltage (Vx1, Vx2) at the corresponding sense pin equals a reference $V_{REF}$ of the feedback amplifier 400. The feedback amplifier 400 can include a current mirror and provide the sensed input voltage through a current-to-voltage conversion at one of the controller sense pins IINSEN, VINSEN.

The feedback amplifier 400 can sense the voltage at either the IINSEN pin, the VINSEN pin, or a combination of the two voltages, such that the currents are adjusted so that the voltages at IINSEN and VINSEN are effectively virtual grounds and match the reference (target) voltage $V_{REF}$. For example, the feedback amplifier 400 regulates the voltage (Vx2) at the sense pin VINSEN to the reference voltage $V_{REF}$ as given by $A_v(V_R-Vx2)$. Alternatively, the common mode loop of amplifier 402 can be used to set the common mode of IINSEN and VINSEN such that the common mode equals the target $V_{REF}$. For example, the feedback amplifier 400 can regulate the voltage at one output of the amplifier 402 to the reference voltage $V_{REF}$ as given by $A_v(V_R-$pi_iinsen_outn). The sense amplifier 402 can be placed before or after the feedback node of the feedback amplifier 400.

Further according to the embodiment shown in FIG. 5, the first terminal of the shunt resistor Rshunt is connected to the input voltage terminal 100 of the regulator, the second terminal of the shunt resistor Rshunt is connected to the power stage 102 and the regulator sense circuitry regulates the voltage at sense pin VINSEN such that the voltage Vx2 at this sense pin remains constant over a range of voltage levels at the input voltage terminal 100 and the current I2 through sense pin VINSEN is a function of the input voltage Vin in the non-calibration mode. That is, the feedback amplifier 400 forces the current I2 through the second level shifting resistor R2 such that the voltage Vx2 at the controller sense pin VINSEN equals the reference $V_{REF}$ of the feedback amplifier 400. The current I2 drawn at sense pin VINSEN to force Vx2=$V_{REF}$ represents the input voltage of the regulator and the feedback amplifier 400 provides the sensed input voltage (pi_vsense_out) through a current-to-voltage conversion at the controller sense pin VINSEN. The input voltage and input current sense circuitry internal to the regulator controller functions as described above in the calibration mode as well, except that the calibration circuit 110/200 electrically connects the first sense pin IINSEN and the second sense pin VINSEN of the controller 104 to the same terminal of the shunt resistor Rshunt via the first level shifting resistor R1 and the second level shifting resistor R2 of the sense network as previously described herein in connection with FIGS. 1 through 3. Other input voltage and input current sense circuitry internal to the regulator controller 104 can be used. In each case, the calibration methods and circuits described herein enable the controller 104 to account for offsets in the measurement data even when the load connected to the regulator is active.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A voltage regulator, comprising:
    an input voltage terminal;
    a power stage electrically coupled to the input voltage terminal;
    a controller configured to control switching of the power stage;
    a sense network comprising a shunt resistor connected in series between the input voltage terminal and the power stage, a first level shifting resistor connected in series between a first terminal of the shunt resistor and a first sense input of the controller, and a second level shifting resistor connected in series between a second terminal of the shunt resistor and a second sense input of the controller; and
    a calibration circuit configured to bypass the shunt resistor and electrically connect the first sense input and the second sense input of the controller to a same node via the first level shifting resistor and the second level shifting resistor of the sense network, responsive to the controller entering a calibration mode.

2. The voltage regulator of claim 1, wherein the controller is configured to measure current and/or voltage at the first and the second sense inputs in the calibration mode, and wherein the controller is configured to use the current and/or voltage measured in the calibration mode as an offset for adjusting current and/or voltage measurements taken by the controller at the first and the second sense inputs outside the calibration mode when the first level shifting resistor is connected to the first terminal of the shunt resistor and the second level shifting resistor is connected to the second terminal of the shunt resistor.

3. The voltage regulator of claim 1, wherein the controller is configured to switch the power stage to regulate a load coupled to the power stage when the controller is in the calibration mode.

4. The voltage regulator of claim 1, wherein the calibration circuit comprises:
    a first transistor connected in series between the second terminal of the shunt resistor and the second level shifting resistor of the sense network;
    a second transistor connected to a gate of the first transistor; and
    a resistor having a first terminal connected to the first terminal of the shunt resistor and a second terminal connected between the first transistor and the second level shifting resistor,
    wherein the second transistor is configured to switch off the first transistor responsive to a calibration mode signal from the controller, the calibration mode signal indicating the controller is entering the calibration mode,
    wherein the first transistor is configured to disconnect the second terminal of the shunt resistor from the second level shifting resistor of the sense network when the second transistor is switched off.

5. The voltage regulator of claim 4, wherein the first transistor is a p-channel transistor, wherein the second transistor is an n-channel transistor, and wherein the calibration circuit further comprises a first pull-up resistor connecting the gate of the p-channel transistor to the second terminal of the shunt resistor and a second pull-up resistor connecting a gate of the n-channel transistor to a voltage supply.

6. The voltage regulator of claim 1, wherein the calibration circuit comprises:
    a first transistor connected in series between the second terminal of the shunt resistor and the second level shifting resistor of the sense network;
    a second transistor connected to a gate of the first transistor;
    a third transistor connecting the first terminal of the shunt resistor to between the first transistor and the second level shifting resistor; and
    a fourth transistor connected to a gate of the third transistor,
    wherein the second transistor is configured to switch off the first transistor responsive to a calibration mode signal from the controller, the calibration mode signal indicating the controller is entering the calibration mode,
    wherein the first transistor is configured to disconnect the second terminal of the shunt resistor from the second level shifting resistor of the sense network when the second transistor is switched off,
    wherein the third transistor is configured to disconnect the first terminal of the shunt resistor from the second level shifting resistor of the sense network if the first transistor is switched on,
    wherein the fourth transistor is configured to switch on the third transistor if the first transistor is switched off, to connect the first terminal of the shunt resistor to the second level shifting resistor of the sense network in the calibration mode.

7. The voltage regulator of claim 6, wherein the first transistor is a first p-channel transistor, wherein the second transistor is a first n-channel transistor, wherein the third transistor is a second p-channel transistor, wherein the fourth transistor is a second n-channel transistor, and wherein the calibration circuit further comprises a first pull-up resistor connecting the gate of the first p-channel transistor to the second terminal of the shunt resistor, a second pull-up resistor connecting a gate of the first n-channel transistor to a voltage supply and a third pull-up resistor connecting the gate of the second p-channel transistor to the first terminal of the shunt resistor.

8. The voltage regulator of claim 1, wherein the controller is configured to enter the calibration mode responsive to a change in regulator temperature, a change in regulator input voltage or a command received by the controller.

9. The voltage regulator of claim 1, wherein the controller is configured to periodically enter the calibration mode at regularly occurring intervals.

10. The voltage regulator of claim 1, wherein the controller is configured to enter the calibration mode responsive to regulator temperature or regulator input voltage changing by more than a predetermined amount compared to the regulator temperature or regulator input voltage from a prior calibration period.

11. The voltage regulator of claim 1, wherein the controller is configured to control the calibration circuit via a signal output of the controller.

12. A method of operating a voltage regulator having a power stage electrically coupled to an input voltage terminal, a controller for controlling the power stage and a shunt resistor of a sense network connected in series between the input voltage terminal and the power stage, the method comprising:
in a non-calibration mode, electrically connecting a first level shifting resistor of the sense network in series between a first terminal of the shunt resistor and a first sense input of the controller and electrically connecting a second level shifting resistor of the sense network in series between a second terminal of the shunt resistor and a second sense input of the controller; and
in a calibration mode, bypassing the shunt resistor and electrically connecting the first sense input and the second sense input of the controller to a same node via the first level shifting resistor and the second level shifting resistor of the sense network.

13. The method of claim 12, further comprising:
measuring current and/or voltage at the first and the second sense inputs in the calibration mode; and
adjusting current and/or voltage measurements taken by the controller at the first and the second sense inputs in the non-calibration mode, based on the current and/or voltage measured in the calibration mode.

14. The method of claim 12, further comprising:
switching the power stage to regulate a load coupled to the power stage when measuring current and/or voltage at the first and the second sense inputs in the calibration mode.

15. The method of claim 12, wherein the voltage regulator comprises a first transistor connected in series between the second terminal of the shunt resistor and the second level shifting resistor of the sense network, a second transistor connected to a gate of the first transistor and a resistor having a first terminal connected to the first terminal of the shunt resistor and a second terminal connected between the first transistor and the second level shifting resistor, the method further comprising:
switching off the first transistor via the second transistor responsive to a calibration mode signal from the controller, the calibration mode signal indicating the controller is entering the calibration mode; and
disconnecting the second terminal of the shunt resistor from the second level shifting resistor of the sense network via the first transistor when the second transistor is switched off.

16. The method of claim 12, wherein the voltage regulator comprises a first transistor connected in series between the second terminal of the shunt resistor and the second level shifting resistor of the sense network, a second transistor connected to a gate of the first transistor, a third transistor connecting the first terminal of the shunt resistor to between the first transistor and the second level shifting resistor, and a fourth transistor connected to a gate of the third transistor, the method further comprising:
switching off the first transistor via the second transistor responsive to a calibration mode signal from the controller, the calibration mode signal indicating the controller is entering the calibration mode;
disconnecting the second terminal of the shunt resistor from the second level shifting resistor of the sense network via the first transistor when the second transistor is switched off;
disconnecting the first terminal of the shunt resistor from the second level shifting resistor of the sense network via the third transistor if the first transistor is switched on; and
switching on the third transistor via the fourth transistor if the first transistor is switched off, to connect the first terminal of the shunt resistor to the second level shifting resistor of the sense network in the calibration mode.

17. The method of claim 12, further comprising:
entering the calibration mode responsive to a change in regulator temperature, a change in regulator input voltage or a command received by the controller.

18. The method of claim 12, further comprising:
periodically entering the calibration mode at regularly occurring intervals.

19. The method of claim 12, further comprising:
entering the calibration mode responsive to regulator temperature or regulator input voltage changing by more than a predetermined amount compared to the regulator temperature or regulator input voltage from a prior calibration period.

20. The method of claim 12, further comprising:
indicating the calibration mode via a signal output of the controller.

* * * * *